United States Patent
Nagai et al.

(10) Patent No.: US 11,042,102 B2
(45) Date of Patent: Jun. 22, 2021

(54) EXTREME ULTRAVIOLET LIGHT GENERATION DEVICE AND ELECTRONIC DEVICE MANUFACTURING METHOD

(71) Applicant: Gigaphoton Inc., Tochigi (JP)

(72) Inventors: Shinji Nagai, Oyama (JP); Takashi Saito, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/894,652

(22) Filed: Jun. 5, 2020

(65) Prior Publication Data

US 2020/0301285 A1    Sep. 24, 2020

Related U.S. Application Data

(63) Continuation of application No. PCT/JP2018/002460, filed on Jan. 26, 2018.

(51) Int. Cl.
*G03F 7/20* (2006.01)
*H05G 2/00* (2006.01)
*B82Y 10/00* (2011.01)

(52) U.S. Cl.
CPC .......... *G03F 7/70916* (2013.01); *B82Y 10/00* (2013.01); *G03F 7/2041* (2013.01);
(Continued)

(58) Field of Classification Search
CPC ...... G03F 7/2041; G03F 7/70; G03F 7/70008; G03F 7/70033; G03F 7/70166;
(Continued)

(56) References Cited

U.S. PATENT DOCUMENTS

2010/0019173 A1* 1/2010 Someya ............... H05G 2/003
                                                            250/496.1
2010/0258749 A1 10/2010 Partlo et al.
(Continued)

FOREIGN PATENT DOCUMENTS

JP   2012-169580 A    9/2012
JP   2012-523693 A    10/2012
(Continued)

OTHER PUBLICATIONS

International Search Report issued in PCT/JP2018/002460; dated Apr. 17, 2018.
(Continued)

*Primary Examiner* — Christina A Riddle
(74) *Attorney, Agent, or Firm* — Studebaker & Brackett PC

(57) ABSTRACT

An extreme ultraviolet light generation device configured to generate extreme ultraviolet light by irradiating a target containing tin with a pulse laser beam includes a chamber container, a hydrogen gas supply unit configured to supply hydrogen gas into the chamber container, a heat shield disposed between the chamber container and a predetermined region in which the target is irradiated with the pulse laser beam inside the chamber container, a first cooling medium flow path disposed in the chamber container, a second cooling medium flow path disposed in the heat shield, and a cooling device configured to supply a first cooling medium to the first cooling medium flow path and
(Continued)

supply a second cooling medium to the second cooling medium flow path so that a temperature of the heat shield becomes lower than a temperature of the chamber container.

20 Claims, 8 Drawing Sheets

(52) U.S. Cl.
CPC ...... *G03F 7/70033* (2013.01); *G03F 7/70166* (2013.01); *G03F 7/70175* (2013.01); *G03F 7/70891* (2013.01); *G03F 7/70925* (2013.01); *H05G 2/005* (2013.01)

(58) Field of Classification Search
CPC .. G03F 7/70175; G03F 7/708; G03F 7/70808; G03F 7/70825; G03F 7/70833; G03F 7/70841; G03F 7/70848–7/70891; G03F 7/70908; G03F 7/70916; G03F 7/70925; G03F 7/70933; G03F 7/70941; G03F 7/7095; G03F 7/70958; G03F 7/70983; H05G 2/00–008; B82Y 10/00; H05H 1/24; G21K 2201/065
USPC .......... 355/30, 52–55, 67–71, 77; 250/492.1, 250/492.2, 492.22, 493.1, 503.1, 505.1, 250/515.1, 517.1, 504 R; 378/34, 35; 315/111.21; 219/121.84; 313/11, 17, 22
See application file for complete search history.

(56) References Cited

U.S. PATENT DOCUMENTS

| | | | |
|---|---|---|---|
| 2011/0226745 A1* | 9/2011 | Nagai | G03F 7/70033 219/121.62 |
| 2013/0003167 A1 | 1/2013 | Dieterich et al. | |
| 2014/0217311 A1* | 8/2014 | Nishisaka | H05G 2/008 250/504 R |
| 2014/0246187 A1 | 9/2014 | Kawasuji et al. | |
| 2019/0364654 A1* | 11/2019 | Ueda | H05G 2/008 |
| 2020/0124976 A1* | 4/2020 | Patel | G03F 7/70916 |

FOREIGN PATENT DOCUMENTS

| | | |
|---|---|---|
| JP | 2013-522889 A | 6/2013 |
| JP | 2014-154616 A | 8/2014 |
| WO | 2010/117859 A1 | 10/2010 |

OTHER PUBLICATIONS

International Preliminary Report on Patentability and Written Opinion issued in PCT/JP2018/002460; dated Jul. 28, 2020.
D. Ugur et al.; "Decomposition of SnH4 Molecules on Metal and Metal-Oxide Surfaces"; Applied Surface Science; 2014; pp. 673-676; vol. 288.

* cited by examiner

EXTREME ULTRAVIOLET LIGHT GENERATION DEVICE AND ELECTRONIC DEVICE MANUFACTURING METHOD

CROSS-REFERENCE TO RELATED APPLICATIONS

The present application is a continuation application of International Application No. PCT/JP2018/002460 filed on Jan. 26, 2018, the entire contents of which are hereby incorporated by reference.

BACKGROUND

1. Technical Field

The present disclosure relates to an extreme ultraviolet light generation device and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 nm to 45 nm and further microfabrication at 32 nm or less will be required. To meet the request for microfabrication at 32 nm or less, for example, it is desired to develop an exposure device including an extreme ultraviolet light generation device configured to generate extreme ultraviolet (EUV) light at a wavelength of 13 nm approximately in combination with reduced projection reflection optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: US Published Patent Application No. 2014/0217311
Patent Document 2: US Published Patent Application No. 2014/0246187
Patent Document 3: US Published Patent Application No. 2010/0258749

Non-Patent Document

Non-Patent Document 1: D. Ugur, A. J. Storm, R. Verberk, J. C. Brouwer, W. G. Sloof, Decomposition of $SnH_4$ molecules on metal and metal-oxide surfaces, Applied Surface Science 288 (2014) 673-676

SUMMARY

An extreme ultraviolet light generation device according to an aspect of the present disclosure generates extreme ultraviolet light by irradiating a target containing tin with a pulse laser beam and includes a chamber container, a hydrogen gas supply unit configured to supply hydrogen gas into the chamber container, a heat shield disposed between the chamber container and a predetermined region in which the target is irradiated with the pulse laser beam inside the chamber container, a first cooling medium flow path disposed in the chamber container, a second cooling medium flow path disposed in the heat shield, and a cooling device configured to supply a first cooling medium to the first cooling medium flow path and supply a second cooling medium to the second cooling medium flow path so that a temperature of the heat shield becomes lower than a temperature of the chamber container.

An extreme ultraviolet light generation device according to another aspect of the present disclosure generates extreme ultraviolet light by irradiating a target containing tin with a pulse laser beam and includes a chamber container, a hydrogen gas supply unit configured to supply hydrogen gas into the chamber container, a heat shield disposed between the chamber container and a predetermined region in which the target is irradiated with the pulse laser beam inside the chamber container, a first cooling medium flow path disposed in the chamber container, a second cooling medium flow path disposed in the heat shield, and a cooling device configured to supply a first cooling medium to the first cooling medium flow path and supply a second cooling medium having a temperature lower than a temperature of the first cooling medium to the second cooling medium flow path.

An electronic device manufacturing method according to another aspect of the present disclosure includes generating extreme ultraviolet light by irradiating a target with a pulse laser beam in an extreme ultraviolet light generation device including a chamber container, a hydrogen gas supply unit configured to supply hydrogen gas into the chamber container, a heat shield disposed between the chamber container and a predetermined region in which the target is irradiated with the pulse laser beam inside the chamber container, a first cooling medium flow path disposed in the chamber container, a second cooling medium flow path disposed in the heat shield, and a cooling device configured to supply a first cooling medium to the first cooling medium flow path and supply a second cooling medium to the second cooling medium flow path so that a temperature of the heat shield becomes lower than a temperature of the chamber container; outputting the extreme ultraviolet light to an exposure apparatus; and exposing a photosensitive substrate to the extreme ultraviolet light in the exposure apparatus to manufacture an electronic device.

An electronic device manufacturing method according to another aspect of the present disclosure includes generating extreme ultraviolet light by irradiating a target with a pulse laser beam in an extreme ultraviolet light generation device including a chamber container, a hydrogen gas supply unit configured to supply hydrogen gas into the chamber container, a heat shield disposed between the chamber container and a predetermined region in which the target is irradiated with the pulse laser beam inside the chamber container, a first cooling medium flow path disposed in the chamber container, a second cooling medium flow path disposed in the heat shield, and a cooling device configured to supply a first cooling medium to the first cooling medium flow path and supply a second cooling medium having a temperature lower than a temperature of the first cooling medium to the second cooling medium flow path; outputting the extreme ultraviolet light to an exposure apparatus; and exposing a photosensitive substrate to the extreme ultraviolet light in the exposure apparatus to manufacture an electronic device.

BRIEF DESCRIPTION OF THE DRAWINGS

Embodiments of the present disclosure will be described below as examples with reference to the accompanying drawings.

DESCRIPTION OF EMBODIMENTS

<Contents>
1. Overall description of extreme ultraviolet light generation system
   1.1 Configuration
   1.2 Operation
2. EUV light generation apparatus according to comparative example
   2.1 Configuration
      2.1.1 Chamber container and heat exchanger
      2.1.2 EUV light condensing mirror and heat exchanger
      2.1.3 Laser beam condensing mirror
      2.1.4 Heat shield and heat exchanger
      2.1.5 Hydrogen gas supply unit and exhaust device
   2.2 Operation
   2.3 Problem
3. EUV light generation apparatus in which temperature of heat shield is lower than that of chamber container
   3.1 Configuration
   3.2 Operation
   3.3 Effect
      3.3.1 Cooling of heat shield
      3.3.2 Cooling of EUV light condensing mirror
4. EUV light generation apparatus including temperature sensor and control unit
   4.1 Configuration
   4.2 Operation and effect
5. EUV light generation apparatus including heat shield on which processing for reducing tin deposition is performed
   5.1 First example
   5.2 Second example
6. Other Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of Extreme Ultraviolet Light Generation System

1.1 Configuration

Figure 1:
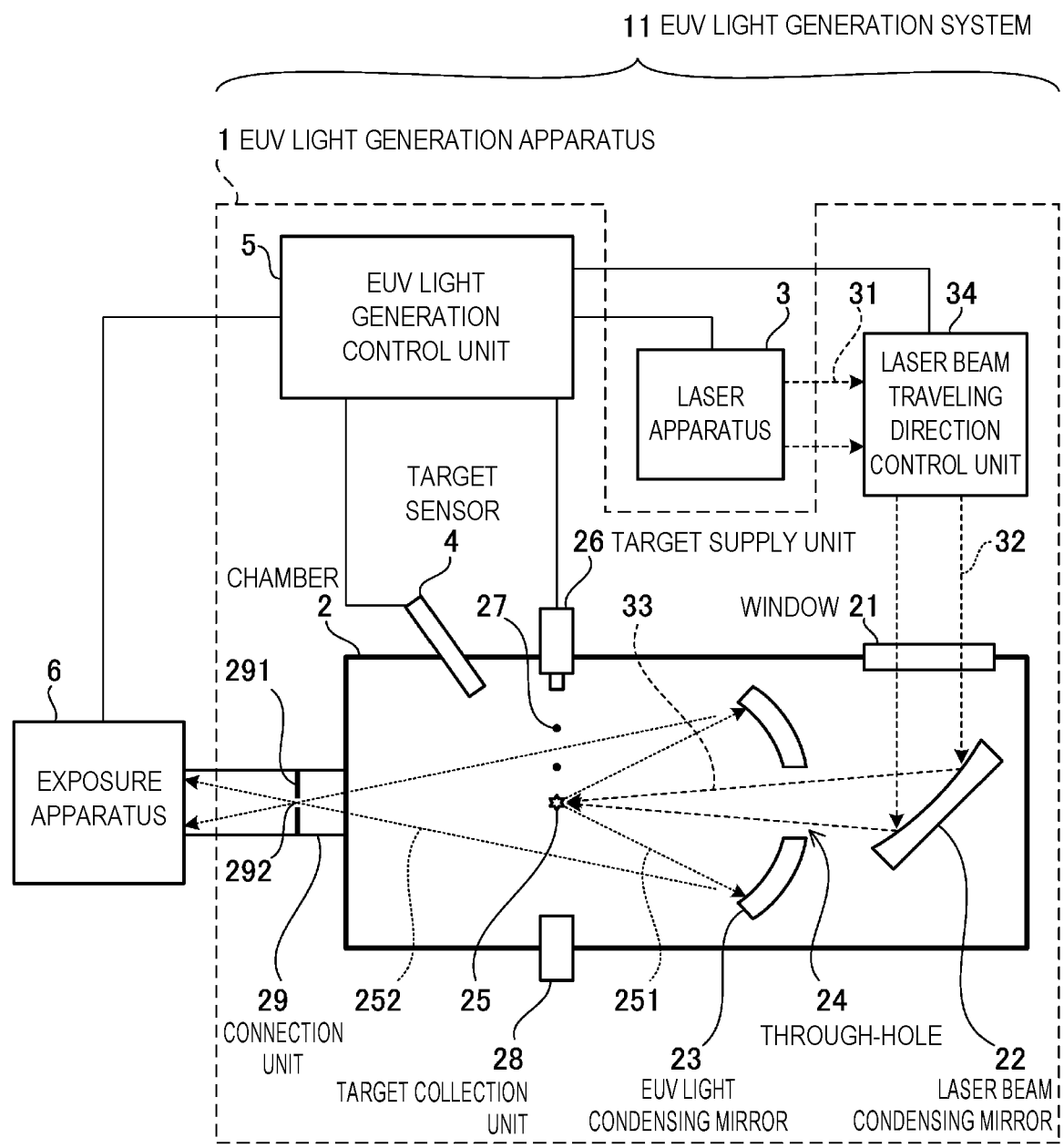
FIG. 1 schematically illustrates the configuration of an exemplary LPP EUV light generation system.

FIG. 1 schematically illustrates the configuration of an exemplary LPP EUV light generation system. An EUV light generation apparatus 1 is used together with at least one laser apparatus 3. In the present application, a system including the EUV light generation apparatus 1 and the laser apparatus 3 is referred to as an EUV light generation system 11. As illustrated in FIG. 1 and described below in detail, the EUV light generation apparatus 1 includes a chamber container 2 and a target supply unit 26. The chamber container 2 is configured to be sealable. The target supply unit 26 is attached, for example, to penetrate through the chamber container 2. The material of a target substance output from the target supply unit 26 contains tin. The material of the target substance may contain tin in combination with terbium, gadolinium, lithium, or xenon.

The chamber container 2 is provided with at least one through-hole. A window 21 is provided to the through-hole. A pulse laser beam 32 output from the laser apparatus 3 transmits through the window 21. The chamber container 2 includes, for example, an EUV light condensing mirror 23 having a spheroidal reflective surface. The EUV light condensing mirror 23 has first and second focal points. For example, a multi-layer reflective film obtained by alternately stacking molybdenum and silicon is formed on the surface of the EUV light condensing mirror 23. The EUV light condensing mirror 23 is disposed so that, for example, the first focal point is positioned in a plasma generation region 25 and the second focal point is positioned at an intermediate focus point (IF) 292. A through-hole 24 is provided at a central part of the EUV light condensing mirror 23. A pulse laser beam 33 passes through the through-hole 24.

The EUV light generation apparatus 1 includes an EUV light generation control unit 5, a target sensor 4, and the like. The target sensor 4 has an image capturing function to detect the existence, trajectory, position, speed, and the like of a target 27.

In addition, the EUV light generation apparatus 1 includes a connection unit 29 that provides communication between the inside of the chamber container 2 and the inside of an exposure apparatus 6. A wall 291 through which an aperture is formed is provided inside the connection unit 29. The wall 291 is disposed so that the aperture is positioned at the second focal point of the EUV light condensing mirror 23.

The EUV light generation apparatus 1 also includes a laser beam traveling direction control unit 34, a laser beam condensing mirror 22, a target collection unit 28 for collecting the target 27, and the like. The laser beam traveling direction control unit 34 includes an optical element for defining the traveling direction of a laser beam, and an actuator for adjusting the position, posture, and the like of the optical element.

1.2 Operation

As illustrated in FIG. 1, a pulse laser beam 31 output from the laser apparatus 3 passes through the laser beam traveling direction control unit 34, transmits through the window 21 as the pulse laser beam 32, and is incident in the chamber container 2. The pulse laser beam 32 travels along at least one laser beam path inside the chamber container 2 and is reflected by the laser beam condensing mirror 22 and incident on at least one target 27 as the pulse laser beam 33.

The target supply unit 26 outputs the target 27 toward the plasma generation region 25 inside the chamber container 2. The target 27 is irradiated with at least one pulse included in the pulse laser beam 33. Plasma is generated from the target 27 being irradiated with the pulse laser beam and radiates radiation light 251. The EUV light condensing mirror 23 reflects EUV light included in the radiation light 251 at a reflectance higher than that of light in other wavelength bands. Reflected light 252 including the EUV light reflected by the EUV light condensing mirror 23 is condensed at the intermediate focus point 292 and output to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes, for example, image data of the target 27 captured by the target sensor 4. In addition, the EUV light generation control unit 5 controls, for example, the output timing of the target 27, the output direction of the target 27, and the like. The EUV light generation control unit 5 also controls, for example, the oscillation timing of the laser apparatus 3, the traveling direction of the pulse laser beam 32, the focusing position of the pulse laser beam 33, and the like. These various kinds of control are merely exemplary, and may include other control as necessary.

2. EUV Light Generation Apparatus According to Comparative Example

2.1 Configuration

2.1.1 Chamber Container and Heat Exchanger

Figure 2:
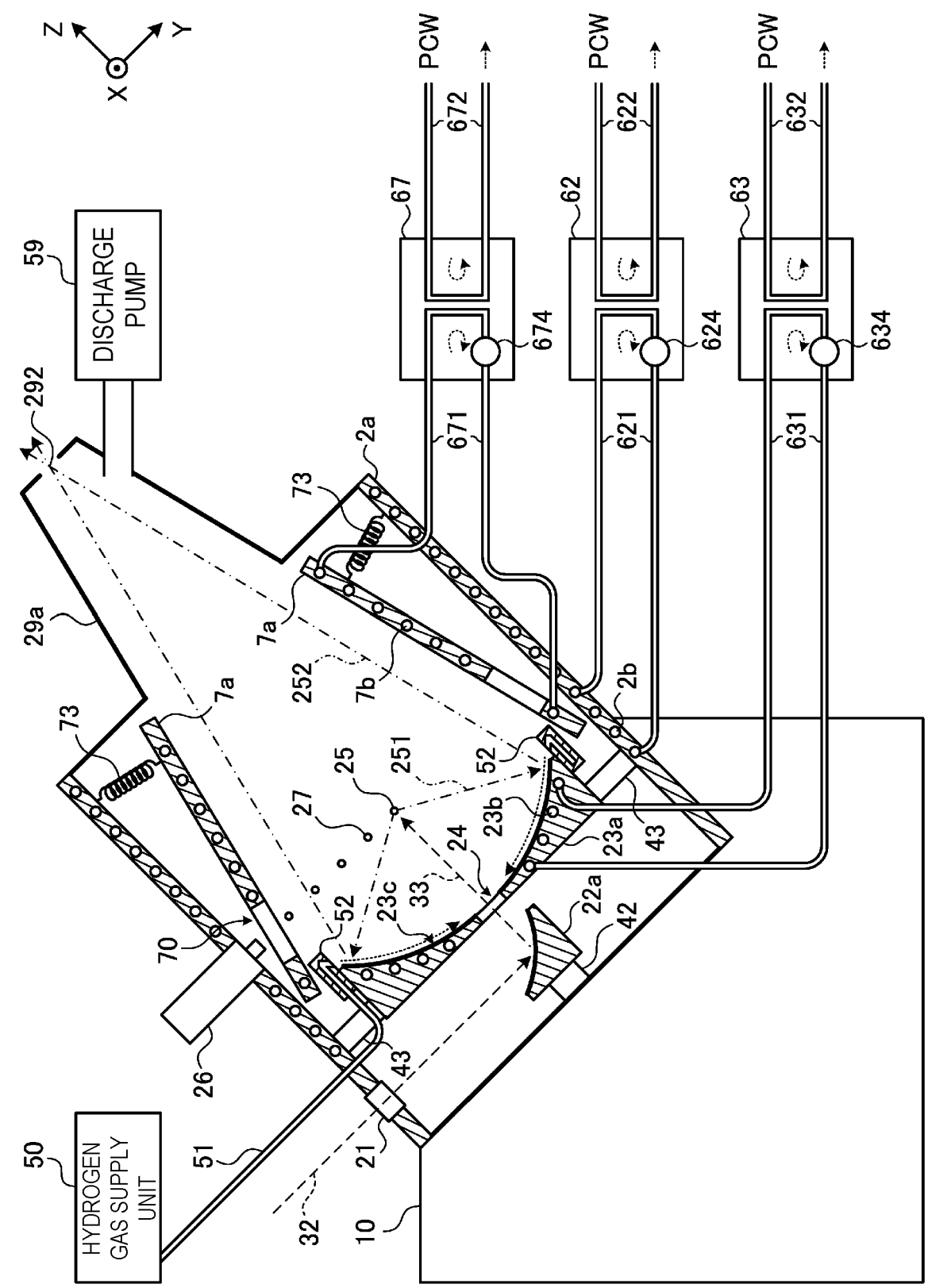
FIG. 2 schematically illustrates the configuration of an EUV light generation apparatus according to a comparative example.

FIG. 2 schematically illustrates the configuration of an EUV light generation apparatus according to a comparative example. As illustrated in FIG. 2, a chamber container 2a is held in a posture oblique to the gravity direction by a chamber holder 10. In the following description, the output direction of the EUV light is defined as a positive Z direction. The output direction of the target 27 is defined as a positive Y direction. A direction orthogonal to the positive Z direction and the positive Y direction is defined as a positive X direction.

An EUV light condensing mirror 23a, a laser beam condensing mirror 22a, and a heat shield 7a are provided inside the chamber container 2a. A plurality of heat exchangers 62, 63, and 67 are provided outside the chamber container 2a. In addition, a hydrogen gas supply unit 50, a discharge pump 59, and a connection unit 29a are attached outside the chamber container 2a.

A cooling medium flow path 2b through which a liquid chamber container cooling medium passes is formed in the chamber container 2a. The chamber container cooling medium is, for example, water. The cooling medium flow path 2b is connected with the heat exchanger 62 through a cooling medium pipe 621. The chamber container cooling medium corresponds to a first cooling medium in the present disclosure. The cooling medium flow path 2b corresponds to a first cooling medium flow path in the present disclosure.

The heat exchanger 62 configured as a cooling device includes part of the cooling medium pipe 621, part of a process cooling water pipe 622, and a circulation pump 624. The cooling medium pipe 621 has one end connected with the exit of the cooling medium flow path 2b, and the other end connected with the entrance of the cooling medium flow path 2b. The heat exchanger 62 is positioned halfway through the cooling medium pipe 621. The circulation pump 624 is disposed at the cooling medium pipe 621.

The process cooling water pipe 622 is included in the flow path of process cooling water (PCW) supplied from outside the device. The process cooling water has a substantially constant temperature, and the temperature is, for example, 10° C. to 14° C. inclusive. The cooling medium pipe 621 and the process cooling water pipe 622 are disposed close to each other so that heat conduction is efficiently performed inside the heat exchanger 62.

2.1.2 EUV Light Condensing Mirror and Heat Exchanger

The EUV light condensing mirror 23a is supported inside the chamber container 2a by an EUV light condensing mirror holder 43.

A cooling medium flow path 23b through which a liquid condensing mirror cooling medium passes is formed in the EUV light condensing mirror 23a. The condensing mirror cooling medium is, for example, water. The cooling medium flow path 23b is connected with the heat exchanger 63 through a cooling medium pipe 631. The condensing mirror cooling medium corresponds to a third cooling medium in the present disclosure. The cooling medium flow path 23b corresponds to a third cooling medium flow path in the present disclosure.

The heat exchanger 63 includes part of the cooling medium pipe 631, part of a process cooling water pipe 632, and a circulation pump 634.

The cooling medium pipe 631 has one end connected with the exit of the cooling medium flow path 23b, and the other end connected with the entrance of the cooling medium flow path 23b. The heat exchanger 63 is positioned halfway through the cooling medium pipe 631. The circulation pump 634 is disposed at the cooling medium pipe 631.

The process cooling water pipe 632 is included in the flow path of the process cooling water supplied from outside the device. The cooling medium pipe 631 and the process cooling water pipe 632 are disposed close to each other so that heat conduction is efficiently performed inside the heat exchanger 63.

2.1.3 Laser Beam Condensing Mirror

The laser beam condensing mirror 22a is supported inside the chamber container 2a by a holder 42. The laser beam condensing mirror 22a is configured as an off-axis parabolic mirror. The off-axis parabolic mirror has a focal point positioned in the plasma generation region 25. The plasma generation region 25 corresponds to a predetermined region in the present disclosure.

2.1.4 Heat Shield and Heat Exchanger

The heat shield 7a is positioned inside the chamber container 2a, surrounding the optical path of the reflected light 252 including the EUV light reflected by the EUV light condensing mirror 23a. In other words, the heat shield 7a is positioned between the plasma generation region 25 and the chamber container 2a. The heat shield 7a has a tapered tubular shape having a diameter that is larger on the negative Z direction side and smaller on the positive Z direction side. Part of the heat shield 7a on the large-diameter side is positioned near an outer peripheral part of the EUV light condensing mirror 23a. Part of the heat shield 7a on the small-diameter side is positioned downstream the optical path of the reflected light 252 including the EUV light reflected by the EUV light condensing mirror 23a.

The heat shield 7a and the chamber container 2a are connected with each other through a plurality of expansion-contraction members 73. A through-hole 70 is formed through the heat shield 7a. The through-hole 70 is positioned on the trajectory of the target 27 between the target supply unit 26 and the plasma generation region 25.

A cooling medium flow path 7b through which a liquid heat shield cooling medium passes is formed in the heat shield 7a. The heat shield cooling medium is, for example, water. The cooling medium flow path 7b is connected with the heat exchanger 67 through a cooling medium pipe 671. The heat shield cooling medium corresponds to a second cooling medium in the present disclosure. The cooling medium flow path 7b corresponds to a second cooling medium flow path in the present disclosure.

The heat exchanger 67 includes part of the cooling medium pipe 671, part of a process cooling water pipe 672, and a circulation pump 674.

The cooling medium pipe 671 has one end connected with the exit of the cooling medium flow path 7b, and the other end connected with the entrance of the cooling medium flow path 7b. The heat exchanger 67 is positioned halfway through the cooling medium pipe 671. The circulation pump 674 is disposed at the cooling medium pipe 671.

The process cooling water pipe 672 is included in the flow path of the process cooling water supplied from outside the device. The cooling medium pipe 671 and the process cooling water pipe 672 are disposed close to each other so that heat conduction is efficiently performed inside the heat exchanger 67.

2.1.5 Hydrogen Gas Supply Unit and Exhaust Device

The hydrogen gas supply unit 50 includes a tank (not illustrated) in which hydrogen gas is housed, and a mass flow controller or an on-off valve (not illustrated). The hydrogen gas supply unit 50 is connected with at least one hydrogen gas supply pipe 51. The hydrogen gas supply pipe 51 penetrates through the chamber container 2a and is connected with a hydrogen gas release unit 52. The hydrogen gas release unit 52 is disposed in an annular shape along the outer periphery of the EUV light condensing mirror 23a.

The discharge pump 59 is connected with the inside of the chamber container 2a or the connection unit 29a. A fine particle trap and a detoxification device (both not illustrated) may be disposed between the discharge pump 59 and the chamber container 2a or the connection unit 29a.

2.2 Operation

The target 27 output from the target supply unit 26 passes through the through-hole 70 of the heat shield 7a and reaches the plasma generation region 25. The pulse laser beam 32 is incident on the laser beam condensing mirror 22a in the chamber container 2a through the window 21. Having been reflected by the laser beam condensing mirror 22a, the pulse laser beam 33 is condensed in the plasma generation region 25. The pulse laser beam 33 reaches the plasma generation region 25 at a timing when the target 27 reaches the plasma generation region 25. Plasma is generated from the target 27 being irradiated with the pulse laser beam 33. The plasma radiates the radiation light 251 including EUV light.

The radiation light 251 radiated from the plasma also includes radiation heat. The radiation heat increases the temperature of the chamber container 2a. As the temperature of the chamber container 2a increases, the chamber container 2a deforms and misalignment of the target supply unit 26 and other components occurs. Thus, the chamber container cooling medium is supplied to the cooling medium flow path 2b disposed in the chamber container 2a to reduce increase of the temperature of the chamber container 2a.

The chamber container cooling medium receives thermal energy from the chamber container 2a and is discharged from the cooling medium flow path 2b. The high-temperature chamber container cooling medium discharged from the cooling medium flow path 2b is cooled to a temperature equal to or slightly higher than the temperature of the process cooling water by the heat exchanger 62. For example, the chamber container cooling medium is cooled to a temperature of 12° C. to 16° C. inclusive. The cooled chamber container cooling medium is returned to the cooling medium flow path 2b.

In addition, the temperature of the EUV light condensing mirror 23a is increased by the radiation heat radiated from the plasma. As the temperature of the EUV light condensing mirror 23a increases, the EUV light condensing mirror 23a deforms and the positions of the first and second focal points of the EUV light condensing mirror 23a are dislocated. Thus, the condensing mirror cooling medium is supplied to the cooling medium flow path 23b disposed in the EUV light condensing mirror 23a to reduce increase of the temperature of the EUV light condensing mirror 23a.

The condensing mirror cooling medium receives thermal energy from the EUV light condensing mirror 23a and is discharged from the cooling medium flow path 23b. The high-temperature condensing mirror cooling medium discharged from the cooling medium flow path 23b is cooled to a temperature equal to or slightly higher than the temperature of the process cooling water by the heat exchanger 63. For example, the condensing mirror cooling medium is cooled to a temperature of 12° C. to 16° C. inclusive. The cooled condensing mirror cooling medium is returned to the cooling medium flow path 23b.

In addition, the heat shield 7a is disposed between the plasma generation region 25 and the chamber container 2a, and the heat shield cooling medium is supplied to the cooling medium flow path 7b disposed in the heat shield 7a. Accordingly, increase of the temperature of the chamber container 2a is reduced.

The heat shield cooling medium receives thermal energy from the heat shield 7a and is discharged from the cooling medium flow path 7b. The high-temperature heat shield cooling medium discharged from the cooling medium flow path 7b is cooled to a temperature equal to or slightly higher than the temperature of the process cooling water by the heat exchanger 67. For example, the heat shield cooling medium is cooled to a temperature of 12° C. to 16° C. inclusive. The cooled heat shield cooling medium is returned to the cooling medium flow path 7b.

Tin debris is also generated from the plasma. Adhesion of the tin debris to a reflective surface 23c of the EUV light condensing mirror 23a decreases the reflectance of the reflective surface 23c. Thus, the hydrogen gas supply unit 50 supplies hydrogen gas to the hydrogen gas release unit 52. The hydrogen gas release unit 52 causes the hydrogen gas to flow along the reflective surface 23c of the EUV light condensing mirror 23a inward from the vicinity of the EUV light condensing mirror 23a. Accordingly, tin is prevented from reaching the reflective surface 23c. In addition, tin adhering to the reflective surface 23c is etched. Specifically, the hydrogen gas is excited into hydrogen radical by the EUV light or the like and becomes stannane gas at room temperature through reaction between the hydrogen radical and tin.

The discharge pump 59 performs discharging so that the pressure inside the chamber container 2a becomes equal to a predetermined pressure lower than atmospheric pressure. Accordingly, the hydrogen gas released from the hydrogen gas release unit 52 and the stannane gas generated through reaction between the hydrogen radical and tin are discharged.

2.3 Problem

The stannane gas generated through reaction between the hydrogen radical and tin is not always immediately discharged by the discharge pump 59, but part of the generated stannane gas remains inside the chamber container 2a for a while in some cases. Inside the chamber container 2a, stannane dissociates into hydrogen gas and tin, and the tin is deposited on the surface of a component inside the chamber container 2a in some cases. In particular, the dissociation speed of stannane is faster near a component at high temperature.

In the comparative example, the cooling of the chamber container 2a, the EUV light condensing mirror 23a, and the heat shield 7a not only reduces deformation of these components but also reduce the stannane dissociation.

However, the temperature of the heat shield 7a cannot be decreased to a temperature at which the stannane dissociation can be sufficiently reduced in some cases. Specifically, since the heat shield 7a is close to the plasma generation region 25 and no component that blocks the radiation heat is disposed between the heat shield 7a and the plasma generation region 25, the temperature of the heat shield 7a is higher than that of the chamber container 2a in some cases. As a result, tin is deposited on the surface of the heat shield 7a in some cases.

When the surface of the heat shield 7a has convex and concave portions, the tin deposition is likely to occur at the convex portions, not uniformly occur. When tin is deposited at a convex portion, the tin deposition is likely to further occur at the same convex portion due to the thickness of the deposited tin. Accordingly, a clump of the deposited tin potentially grows at a particular position on the surface of the heat shield 7a and eventually blocks part of the optical path of the reflected light 252. In addition, the grown clump of the deposited tin potentially flakes off the heat shield 7a and falls on the reflective surface 23c of the EUV light condensing mirror 23a, which reduces the reflectance of the EUV light condensing mirror 23a. In addition, the leading end of the grown deposited tin is not sufficiently cooled, and thus is heated to a temperature equal to or higher than the melting point of tin and potentially drips onto the reflective surface 23c of the EUV light condensing mirror 23a.

In embodiments described below, the chamber container cooling medium is supplied to the cooling medium flow path 2b and the heat shield cooling medium is supplied to the cooling medium flow path 7b so that the temperature of the heat shield 7a becomes lower than the temperature of the chamber container 2a.

3. EUV Light Generation Apparatus in which Temperature of Heat Shield is Lower than that of Chamber Container

3.1 Configuration

Figure 3:
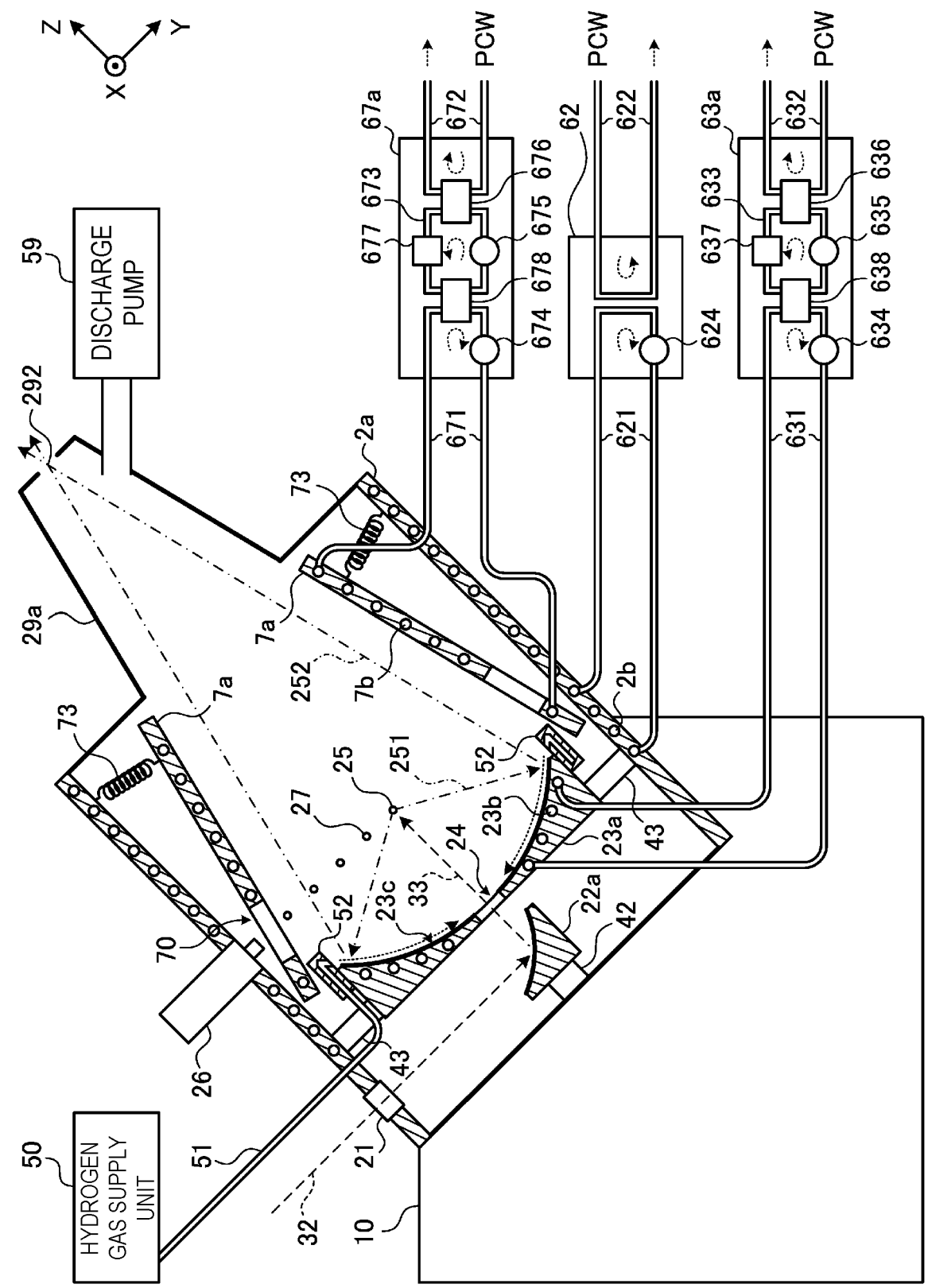
FIG. 3 schematically illustrates the configuration of the EUV light generation apparatus according to a first embodiment of the present disclosure.

FIG. 3 schematically illustrates the configuration of the EUV light generation apparatus according to a first embodiment of the present disclosure. In the first embodiment, chillers 67a and 63a are provided in place of the heat exchangers 67 and 63, respectively, described with reference to FIG. 2.

The chiller 67a includes a refrigerant pipe 673 having an annular shape. A compressor 675, a condenser 676, an expansion valve 677, and an evaporator 678 are disposed in the stated order at the refrigerant pipe 673. For example, a material that stores a large amount of latent heat at evaporation is selected as refrigerant filling the refrigerant pipe 673.

The compressor 675 compresses and feeds the refrigerant from the evaporator 678 side to the condenser 676 side. In the condenser 676, the refrigerant pipe 673 and the process cooling water pipe 672 are disposed close to each other. The expansion valve 677 is a throttle valve configured to restrict flow of the refrigerant from the condenser 676 side at high pressure to the evaporator 678 side at low pressure. In the evaporator 678, the refrigerant pipe 673 and the cooling medium pipe 671 are disposed close to each other.

The configuration of the chiller 63a is same as the configuration of the chiller 67a. Each component of the chiller 63a is denoted by a reference sign starting with "63". As for the other features, the configuration of the first embodiment is same as the configuration of the comparative example.

3.2 Operation

In the chiller 67a, the refrigerant compressed into high-temperature and high-pressure gas by the compressor 675 releases heat through condensation in the condenser 676. Part of this thermal energy is provided to the process cooling water. As the refrigerant having become room-temperature and high-pressure liquid through the condenser 676 is ejected from the expansion valve 677 toward the evaporator 678, the pressure thereof decreases and the refrigerant becomes low-temperature and low-pressure liquid. In the evaporator 678, the refrigerant absorbs heat through evaporation and stores the thermal energy as latent heat. Part of this thermal energy is provided from the heat shield cooling medium. The refrigerant becomes low-temperature and low-pressure gas and is returned to the compressor 675.

In this manner, the chiller 67a can cool the heat shield cooling medium to a temperature lower than the temperature of the process cooling water. The temperature of the heat shield cooling medium may be, for example, 0° C. or lower. The cooled heat shield cooling medium is returned to the cooling medium flow path 7b and cools the heat shield 7a.

The operation of the chiller 63a is same as the operation of the chiller 67a. However, the chiller 63a cools the condensing mirror cooling medium. As for the other features, the operation of the first embodiment is same as the operation of the comparative example.

3.3 Effect

3.3.1 Cooling of Heat Shield

According to the first embodiment, the heat shield 7a can be cooled so that the stannane dissociation at the heat shield 7a is reduced by cooling the heat shield cooling medium to a temperature lower than the temperature of the process cooling water. Accordingly, the tin deposition on the surface of the heat shield 7a can be reduced.

Similarly to the comparative example, increase of the temperature of the chamber container 2a is reduced by using the heat exchanger 62. When the chamber container cooling medium is cooled to a temperature equal to the temperature of the heat shield cooling medium, the chamber container 2a is potentially cooled than needed. For example, dew condensation of steam in air potentially occurs on the surface of the chamber container 2a. The dew condensation on the chamber container 2a potentially affects the operation of the EUV light generation apparatus. Thus, it is desirable that the temperature of the heat shield cooling medium supplied to the cooling medium flow path 7b is lower than the temperature of the chamber container cooling medium supplied to the cooling medium flow path 2b.

Figure 4:
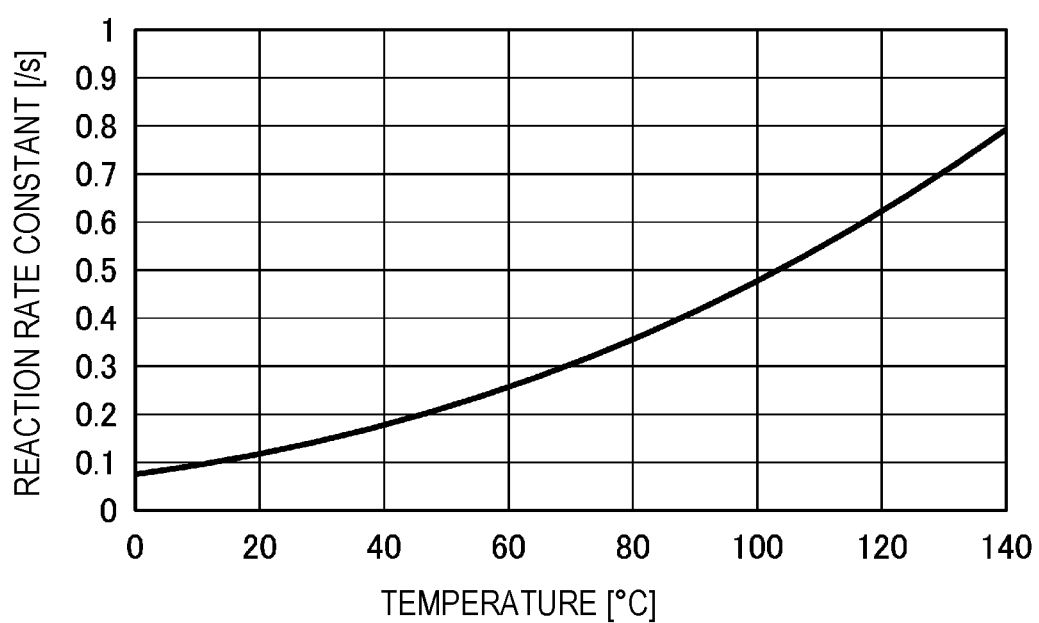
FIG. 4 is a graph illustrating the relation between the Celsius temperature of the surface of an in-chamber component and the reaction rate constant of dissociation reaction of stannane gas near the surface.

FIG. 4 is a graph illustrating the relation between the Celsius temperature of the surface of an in-chamber component and the reaction rate constant of stannane gas dissociation reaction near the surface. The dissociation speed of stannane gas can be approximated by using the reaction rate constant in the Arrhenius equation below.

$$k = Ae^{-Ea/RT}$$

In the above expression, k represents the reaction rate constant, A represents the pre-exponential factor, e represents the Napierian logarithm, Ea represents the activation energy, R represents the gas constant, and T represents the absolute temperature. The graph in FIG. 4 is based on this expression.

As illustrated in FIG. 4, the reaction rate constant of stannane gas dissociation reaction increases as the surface temperature of the in-chamber component is increased, and the increase rate of the reaction rate constant of stannane gas dissociation reaction increases as the surface temperature of the in-chamber component is increased.

When the surface temperature of the in-chamber component is 5° C. or lower, the dissociation speed of stannane gas is low, and thus the speed of tin etching by the hydrogen radical is higher than the speed of tin deposition on the in-chamber component.

When the surface temperature of the in-chamber component exceeds 5° C. but not 40° C. approximately, the speed of tin deposition on the in-chamber component and the speed of tin etching by the hydrogen radical are expected to be balanced.

When the surface temperature of the in-chamber component exceeds 40° C., the speed of tin deposition on the in-chamber component is higher than the speed of tin etching by the hydrogen radical.

Thus, the temperature of the heat shield 7a is preferably 40° C. or lower. Furthermore, the temperature of the heat shield 7a is more preferably 5° C. or lower.

The heat shield 7a is desirably cooled to a temperature lower than the temperature of the chamber container 2a. For example, when the heat shield 7a is maintained at 5° C. or lower, the chamber container 2a is desirably maintained at 15° C. to 25° C. inclusive.

3.3.2 Cooling of EUV Light Condensing Mirror

According to the first embodiment, the tin deposition on the EUV light condensing mirror 23a can be reduced by cooling the condensing mirror cooling medium to a temperature lower than the temperature of the process cooling water.

In addition, the temperature of the condensing mirror cooling medium supplied to the cooling medium flow path 23b is desirably lower than the temperature of the chamber container cooling medium supplied to the cooling medium flow path 2b.

Similarly to the above description on the heat shield 7a, the temperature of the EUV light condensing mirror 23a is preferably 40° C. or lower.

Furthermore, the temperature of the EUV light condensing mirror 23a is more preferably 5° C. or lower.

The EUV light condensing mirror 23a is desirably cooled to a temperature lower than the temperature of the chamber container 2a. For example, when the EUV light condensing mirror 23a is maintained at 5° C. or lower, the chamber container 2a is desirably maintained at 15° C. to 25° C. inclusive.

4. EUV Light Generation Apparatus Including Temperature Sensor and Control Unit

4.1 Configuration

Figure 5:
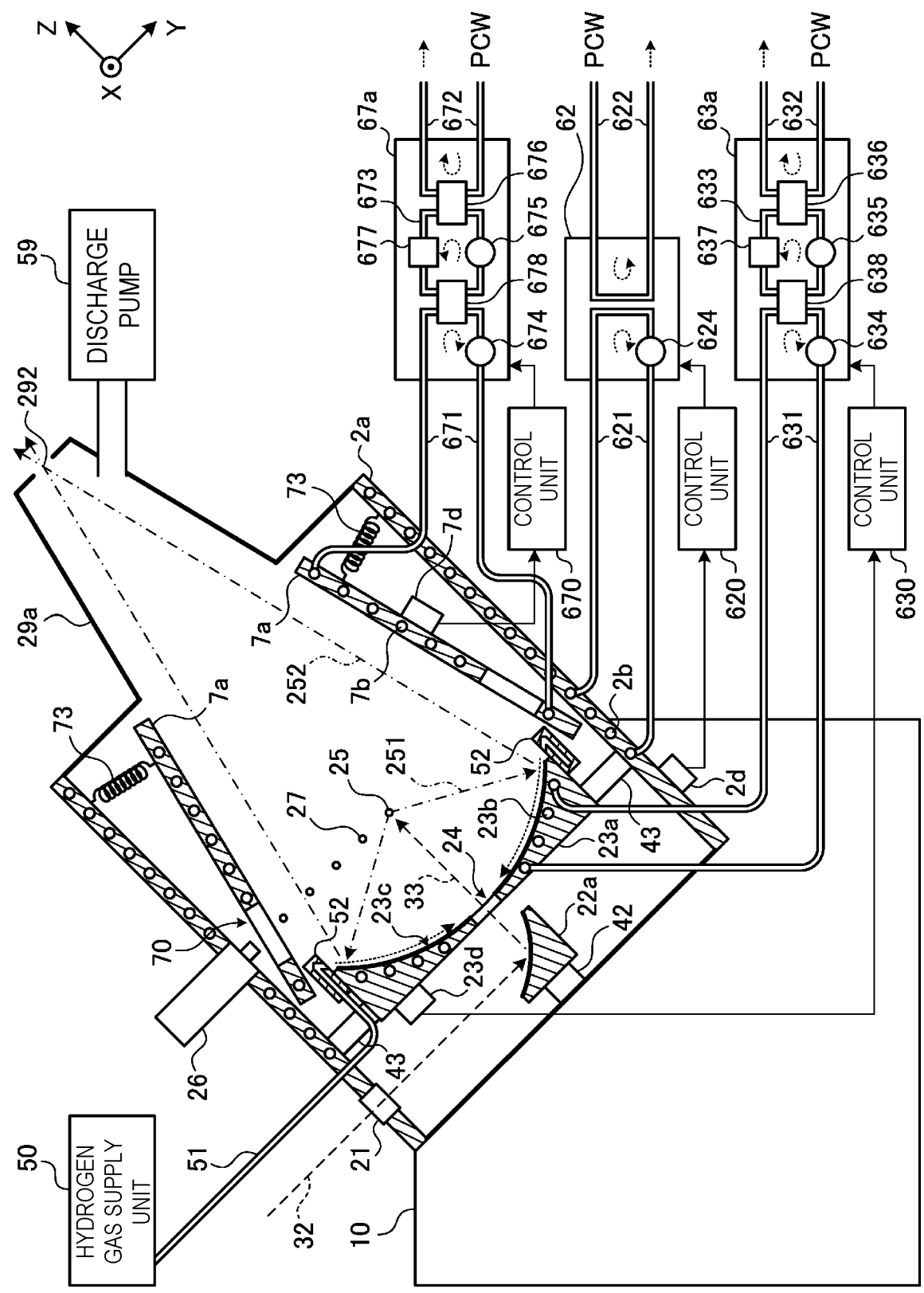
FIG. 5 schematically illustrates the configuration of the EUV light generation apparatus according to a second embodiment of the present disclosure.

FIG. 5 schematically illustrates the configuration of the EUV light generation apparatus according to a second embodiment of the present disclosure. In the second embodiment, a heat shield temperature sensor 7d, a chamber container temperature sensor 2d, and a condensing mirror temperature sensor 23d are provided in addition to the configuration of the first embodiment described with reference to FIG. 3. In the second embodiment, control units 670, 620, and 630 are also provided.

The heat shield temperature sensor 7d is configured as, for example, a thermocouple. The heat shield temperature sensor 7d detects the temperature of the heat shield 7a. The heat shield temperature sensor 7d may include a plurality of sensors provided at a plurality of positions on the heat shield 7a. The temperature of the heat shield 7a may be the average of temperatures detected by the sensors or may be the highest value among the temperatures detected by the sensors. The heat shield temperature sensor 7d corresponds to a second temperature sensor in the present disclosure.

The chamber container temperature sensor 2d is configured as, for example, a thermocouple. The chamber container temperature sensor 2d detects the temperature of the chamber container 2a. The chamber container temperature sensor 2d may include a plurality of sensors provided at a plurality of positions on the chamber container 2a. The temperature of the chamber container 2a may be the average of temperatures detected by the sensors or may be the highest value among the temperatures detected by the sensors. The chamber container temperature sensor 2d corresponds to a first temperature sensor in the present disclosure.

The condensing mirror temperature sensor 23d is configured as, for example, a thermocouple. The condensing mirror temperature sensor 23d detects the temperature of the EUV light condensing mirror 23a. The condensing mirror temperature sensor 23d may include a plurality of sensors provided at a plurality of positions on the EUV light condensing mirror 23a. The temperature of the EUV light condensing mirror 23a may be the average of temperatures detected by the sensors or may be the highest value among the temperatures detected by the sensors. The condensing mirror temperature sensor 23d corresponds to a third temperature sensor in the present disclosure.

The control unit 670 controls the chiller 67a based on the temperature of the heat shield 7a detected by the heat shield temperature sensor 7d. The control of the chiller 67a includes, for example, control of the circulation pump 674. Alternatively, the control of the chiller 67a includes control of the expansion valve 677.

The control unit 620 controls the heat exchanger 62 based on the temperature of the chamber container 2a detected by the chamber container temperature sensor 2d. The control of the heat exchanger 62 includes, for example, control of the circulation pump 624.

The control unit 630 controls the chiller 63a based on the temperature of the EUV light condensing mirror 23a detected by the condensing mirror temperature sensor 23d. The control of the chiller 63a includes, for example, control of the circulation pump 634. Alternatively, the control of the chiller 63a includes control of the expansion valve 637.

As for the other features, the configuration of the second embodiment is same as the configuration of the first embodiment.

4.2 Operation and Effect

Figure 6A:
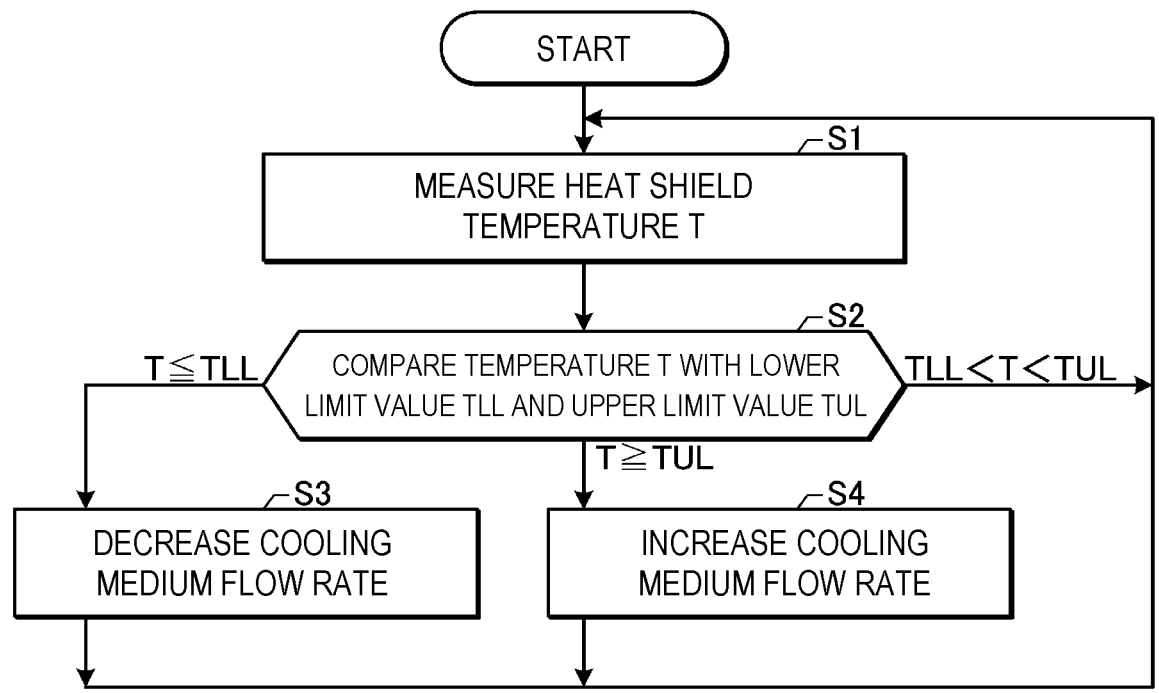
FIG. 6A is a flowchart illustrating a first exemplary operation of a control unit in the second embodiment.

FIG. 6A is a flowchart illustrating a first exemplary operation of a control unit in the second embodiment. The control unit 670 adjusts the flow rate of the heat shield cooling medium by controlling the chiller 67a as described below.

First at S1, the control unit 670 measures a temperature T of the heat shield 7a. Specifically, the control unit 670 receives an analog signal indicating the temperature of the heat shield 7a from the heat shield temperature sensor 7d and converts the analog signal into a digital signal.

Subsequently at S2, the control unit 670 compares the temperature T of the heat shield 7a with a lower limit value TLL and an upper limit value TUL. The lower limit value TLL is, for example, 0° C., and the upper limit value TUL is, for example, 5° C. When the temperature T of the heat shield 7a is equal to or lower than the lower limit value TLL, the control unit 670 advances the processing to S3. When the temperature T of the heat shield 7a is equal to or higher than the upper limit value TUL, the control unit 670 advances the processing to S4. When the temperature T of the heat shield 7a is between the lower limit value TLL and the upper limit value TUL, the control unit 670 returns the processing to S1 without controlling the chiller 67a, and repeats the processing of the present flowchart.

At S3, the control unit 670 performs processing of decreasing the flow rate of the heat shield cooling medium to a flow rate lower than the current flow rate. For example, the control unit 670 controls the circulation pump 674 so that the rotation speed of the circulation pump 674 becomes lower than the current rotation speed. Accordingly, when the temperature T of the heat shield 7a is equal to or lower than the lower limit value TLL, the temperature T of the heat shield 7a can be adjusted to be higher than the temperature of the lower limit value TLL. Thereafter, the control unit 670 returns the processing to S1 and repeats the processing of the present flowchart.

When the determination is performed only on the upper limit value TUL of the temperature T of the heat shield 7a, the determination on the lower limit value TLL at S2 and the processing at S3 may be omitted.

At S4, the control unit 670 performs processing of increasing the flow rate of the heat shield cooling medium to a flow rate higher than the current flow rate. For example, the control unit 670 controls the circulation pump 674 so that the rotation speed of the circulation pump 674 becomes higher than the current rotation speed. Accordingly, when the temperature T of the heat shield 7a is equal to or higher than the upper limit value TUL, the temperature T of the heat shield 7a can be adjusted to be lower than the temperature of the upper limit value TUL. Thereafter, the control unit 670 returns the processing to S1 and repeats the processing of the present flowchart.

Although the above description is made on the example in which the control unit 670 controls the flow rate of the heat shield cooling medium based on the temperature T of the heat shield 7a, the control unit 620 may control the flow rate of the chamber container cooling medium based on the temperature of the chamber container 2a in a similar manner. Further, the control unit 630 may control the flow rate of the condensing mirror cooling medium based on the temperature of the EUV light condensing mirror 23a in a similar manner.

Figure 6B:
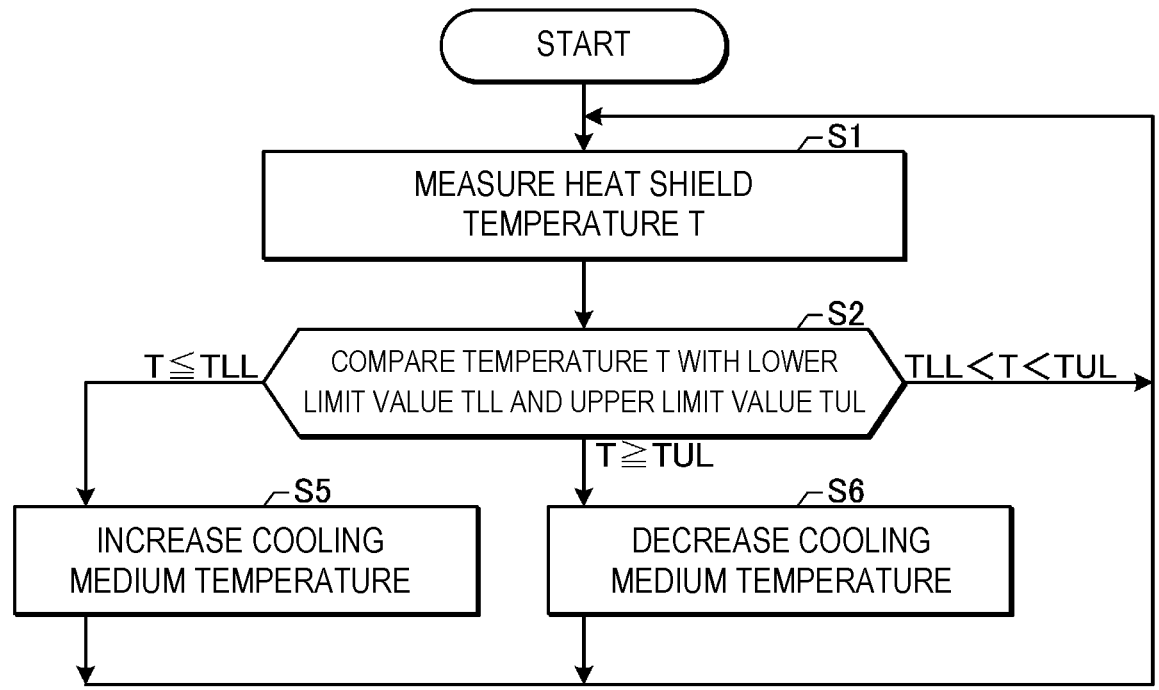
FIG. 6B is a flowchart illustrating a second exemplary operation of the control unit in the second embodiment.

FIG. 6B is a flowchart illustrating a second exemplary operation of a control unit in the second embodiment. The control unit 670 adjusts the temperature of the heat shield cooling medium by controlling the chiller 67a as described below.

Processing at S1 and S2 is same as that described with reference to FIG. 6A. However, when the temperature T of the heat shield 7a is equal to or lower than the lower limit value TLL, the control unit 670 advances the processing to S5. When the temperature T of the heat shield 7a is equal to or higher than the upper limit value TUL, the control unit 670 advances the processing to S6.

At S5, the control unit 670 performs processing of increasing the temperature of the heat shield cooling medium supplied to the heat shield 7a to a temperature higher than the current temperature. The temperature of the heat shield cooling medium may be adjusted by an optional method. For example, when the expansion valve 677 includes a bypass flow path so that liquid on the room-temperature and high-pressure side can be introduced to the low-temperature and low-pressure side through the bypass flow path, the control unit 670 controls the valve opening degree of the bypass flow path. The cooling capacity of the chiller 67a can be reduced by increasing the valve opening degree of the bypass flow path. Accordingly, when the temperature T of the heat shield 7a is equal to or lower than the lower limit value TLL, the temperature T of the heat shield 7a can be adjusted to be higher than the lower limit value TLL. Thereafter, the control unit 670 returns the processing to S1 and repeats the processing of the present flowchart.

When the determination is performed only on the upper limit value TUL of the temperature T of the heat shield 7a, the determination on the lower limit value TLL at S2 and the processing at S5 may be omitted.

At S6, the control unit 670 performs processing of decreasing the temperature of the heat shield cooling medium supplied to the heat shield 7a to a temperature lower than the current temperature. For example, the cooling capacity of the chiller 67a can be improved by reducing the valve opening degree of the bypass flow path. Accordingly, when the temperature T of the heat shield 7a is equal to or higher than the upper limit value TUL, the temperature T of the heat shield 7a can be adjusted to be lower than the upper limit value TUL. Thereafter, the control unit 670 returns the processing to S1 and repeats the processing of the present flowchart.

Although the above description is made on the example in which the control unit 670 controls the temperature of the heat shield cooling medium based on the temperature T of the heat shield 7a, the control unit 630 may control the temperature of the condensing mirror cooling medium based on the temperature of the EUV light condensing mirror 23a in a similar manner.

Alternatively, the control unit 670 may control both the flow rate and temperature of the heat shield cooling medium. The control unit 630 may control both the flow rate and temperature of the condensing mirror cooling medium.

The temperature of a component in the chamber container 2a potentially varies due to an output condition of EUV light and the like. According to the second embodiment, the temperature of the component in the chamber container 2a can be adjusted to a desired range by controlling a chiller or a heat exchanger based on the measured value of the temperature of the component in the chamber container 2a.

As for the other features, the operation and effect of the second embodiment are same as the operation and effect of the first embodiment.

Figure 7A:
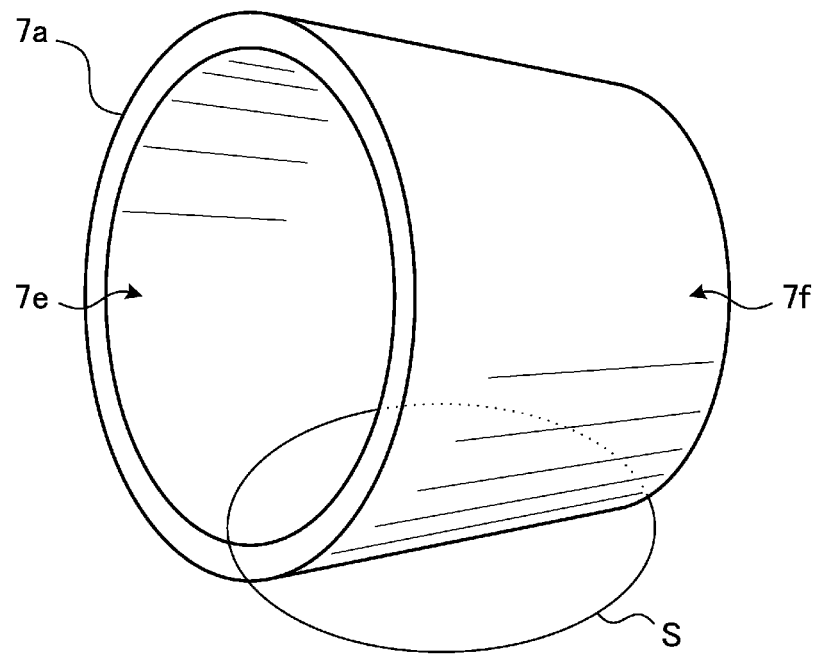
FIG. 7A is a perspective view of a heat shield included in the EUV light generation apparatus according to a third embodiment of the present disclosure.

5. EUV Light Generation Apparatus Including Heat Shield on which Processing for Reducing Tin Deposition is Performed FIG. 7A is a perspective view of the heat shield included in the EUV light generation apparatus according to a third embodiment of the present disclosure. The heat shield 7a has a tapered tubular shape as described above. An inner surface 7e of the heat shield 7a faces the plasma generation region 25. With this configuration, tin is more likely to be deposited on the inner surface 7e than on an outer surface 7f of the heat shield 7a.

Thus, in the third embodiment, the inner surface 7e of the heat shield 7a is processed to reduce the tin deposition.

5.1 First Example

Figure 7B:
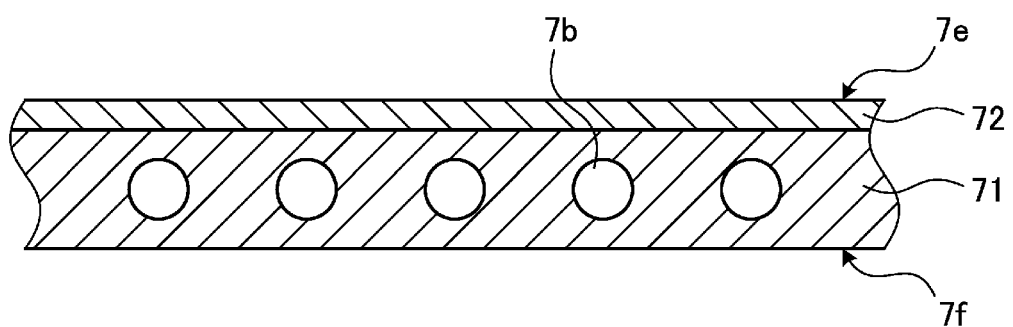
FIG. 7B is an enlarged cross-sectional view of the heat shield in a first example of the third embodiment.

FIG. 7B is an enlarged cross-sectional view of the heat shield 7a in a first example of the third embodiment. FIG. 7B corresponds to an enlarged view of a cross-section of the heat shield 7a near a circle S in FIG. 7A.

The heat shield 7a in the first example includes a base material 71 and a coating layer 72. The cooling medium flow path 7b is formed in the base material 71. The coating layer 72 is positioned on the inner surface 7e side of the heat shield 7a. The coating layer 72 contains, for example, $TiO_2$ or ZrN. When the coating layer 72 is made of a material containing $TiO_2$ or ZrN, the tin deposition on the inner surface 7e of the heat shield 7a can be reduced. Alternatively, tin etching can be promoted on the inner surface 7e of the heat shield 7a.

The coating layer 72 is entirely formed on the inner surface 7e side of the heat shield 7a in the above description, but the present disclosure is not limited thereto. The coating layer 72 may be formed only on part of the inner surface 7e of the heat shield 7a on the large-diameter side close to the outer peripheral part of the EUV light condensing mirror 23a but not on part thereof on the small-diameter side. When the discharge pump 59 is connected with the chamber container 2a, the coating layer 72 may be formed at a position on the inner surface 7e of the heat shield 7a, which is close to a discharge port of the chamber container 2a connected with the discharge pump 59.

Alternatively, the coating layer 72 may be formed on the entire surface of the heat shield 7a including the outer surface 7f of the heat shield 7a.

5.2 Second Example

Figure 7C:
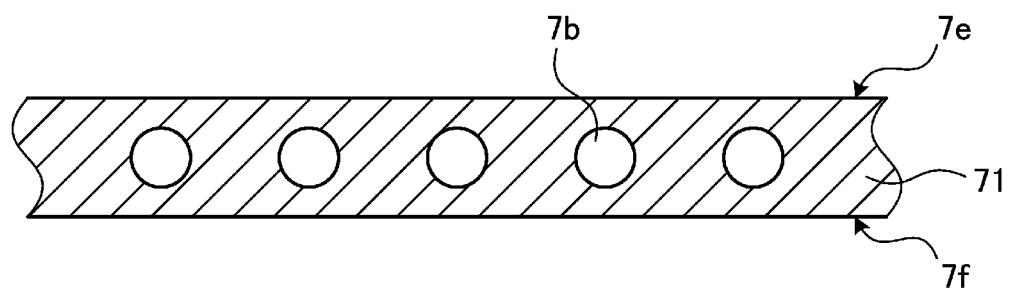
FIG. 7C is an enlarged cross-sectional view of the heat shield in a second example of the third embodiment.

FIG. 7C is an enlarged cross-sectional view of the heat shield 7a in a second example of the third embodiment. FIG. 7C corresponds to an enlarged view of a cross-section of the heat shield 7a near the circle S in FIG. 7A.

The heat shield 7a in the second example may not include the coating layer 72. Instead, the base material 71 in the second example is processed to reduce a surface roughness Ra of the inner surface 7e. For example, the surface roughness Ra of the inner surface 7e is desirably 6.3 µm or less. The surface roughness Ra of the inner surface 7e is more desirably 1.6 µm or less.

As for the other features, the second example is same as the first example.

When the surface of the heat shield 7a has convex and concave portions, the tin deposition is likely to occur at the convex portions as described above. This is thought to be because the heat conduction path from the cooling medium flow path 7b to each convex portion is longer than the heat conduction path from the cooling medium flow path 7b to the other part, and the cross-sectional area of the heat conduction path from the cooling medium flow path 7b to each convex portion is smaller than the cross-sectional area of the heat conduction path from the cooling medium flow path 7b to the other part.

According to the second example, since the surface roughness Ra of the inner surface 7e is reduced, the size of each convex portion at which the tin deposition is likely to occur can be reduced so that the tin deposition is reduced.

The processing for reducing the surface roughness Ra is entirely performed on the inner surface 7e side of the heat shield 7a in the above description, but the present disclosure is not limited thereto. The processing for reducing the surface roughness Ra may be performed only on part of the inner surface 7e of the heat shield 7a on the large-diameter side close to the outer peripheral part of the EUV light condensing mirror 23a but not on part thereof on the small-diameter side. When the discharge pump 59 is connected with the chamber container 2a, the processing for reducing the surface roughness Ra may be performed at a position on the inner surface 7e of the heat shield 7a, which is close to the discharge port of the chamber container 2a connected with the discharge pump 59.

Alternatively, the processing for reducing the surface roughness Ra may be performed on the entire surface of the heat shield 7a including the outer surface 7f of the heat shield 7a.

The base material 71 may be made of a material containing $TiO_2$ or ZrN.

The tin deposition can be further reduced by setting the surface roughness Ra of the coating layer 72 in the first example to be equal to or smaller than the above-described value.

In addition, the heat shield 7a desirably has not only the reduced surface roughness but also a shape including the reduced number of protrusions.

6. Other

Figure 8:
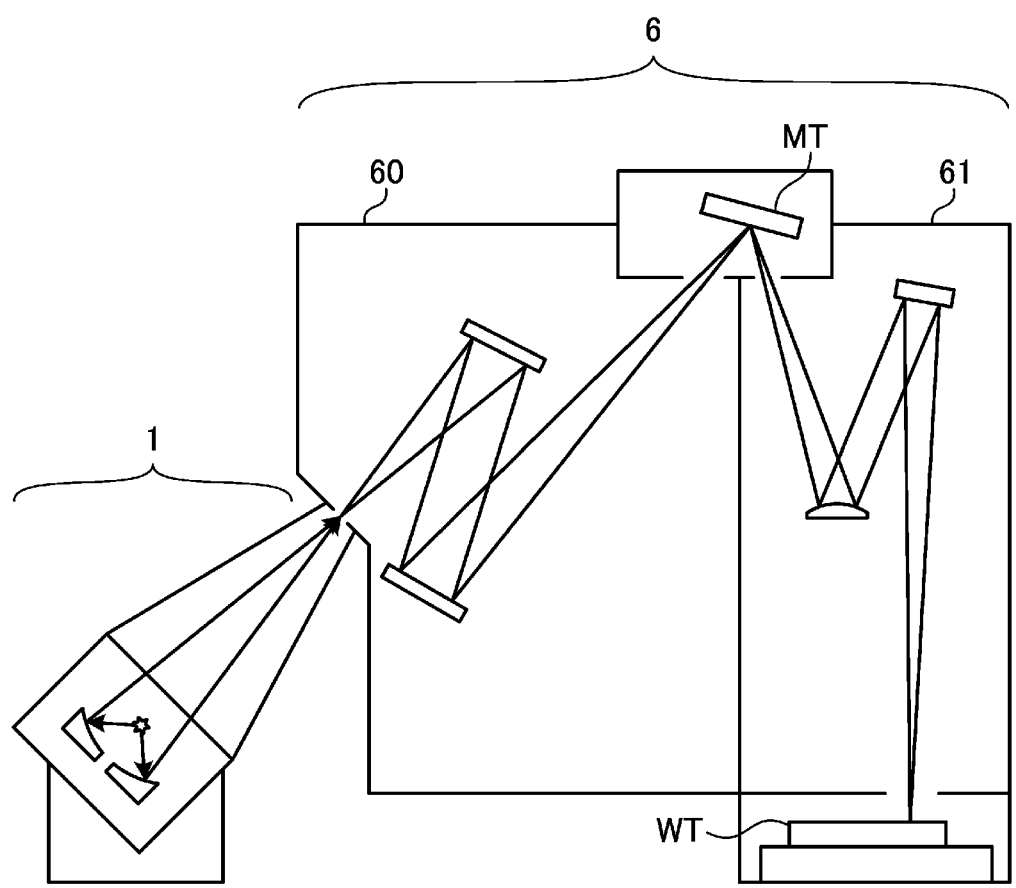
FIG. 8 schematically illustrates the configuration of an exposure apparatus connected with the EUV light generation apparatus.

FIG. 8 schematically illustrates the configuration of the exposure apparatus connected with the EUV light generation apparatus.

In FIG. 8, the exposure apparatus 6 includes a mask irradiation unit 60 and a workpiece irradiation unit 61. The mask irradiation unit 60 illuminates, with EUV light incident from the EUV light generation apparatus 1, a mask pattern on a mask table MT through a reflected optical system. The workpiece irradiation unit 61 images the EUV light reflected by the mask table MT onto a workpiece (not illustrated) disposed on a workpiece table WT through the reflected optical system. The workpiece is a photosensitive substrate such as a semiconductor wafer to which a photoresist is applied. The exposure apparatus 6 translates the mask table MT and the workpiece table WT in synchronization with each other to expose the workpiece to the EUV light reflected by the mask pattern. Through an exposure process as described above, a device pattern is transferred onto the semiconductor wafer to manufacture an electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless otherwise indicated. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation device configured to generate extreme ultraviolet light by irradiating a target containing tin with a pulse laser beam, the extreme ultraviolet light generation device comprising:
   a chamber container;
   a hydrogen gas supply unit configured to supply hydrogen gas into the chamber container;
   a heat shield disposed between the chamber container and a predetermined region in which the target is irradiated with the pulse laser beam inside the chamber container;
   a first cooling medium flow path disposed in the chamber container;
   a second cooling medium flow path disposed in the heat shield; and
   a cooling device configured to supply a first cooling medium to the first cooling medium flow path and supply a second cooling medium to the second cooling medium flow path so that a temperature of the heat shield becomes lower than a temperature of the chamber container.

2. The extreme ultraviolet light generation device according to claim 1, wherein the temperature of the heat shield is maintained at 40° C. or lower.

3. The extreme ultraviolet light generation device according to claim 1, wherein
   the temperature of the heat shield is maintained at 5° C. or lower, and
   the temperature of the chamber container is maintained at 15° C. to 25° C. inclusive.

4. The extreme ultraviolet light generation device according to claim 1, further comprising:
   a first temperature sensor configured to detect the temperature of the chamber container; and
   a control unit configured to control the cooling device to change a flow rate of the first cooling medium in accordance with the temperature detected by the first temperature sensor.

5. The extreme ultraviolet light generation device according to claim 1, further comprising:
   a second temperature sensor configured to detect the temperature of the heat shield; and
   a control unit configured to control the cooling device to change at least one of the temperature and a flow rate of the second cooling medium in accordance with the temperature detected by the second temperature sensor.

6. The extreme ultraviolet light generation device according to claim 1, further comprising:
   a condensing mirror configured to reflect and condense the extreme ultraviolet light radiated from the predetermined region; and
   a third cooling medium flow path disposed in the condensing mirror,
   wherein the cooling device supplies a third cooling medium to the third cooling medium flow path so that a temperature of the condensing mirror becomes lower than the temperature of the chamber container.

7. The extreme ultraviolet light generation device according to claim 6, wherein the temperature of the condensing mirror is maintained at 40° C. or lower.

8. The extreme ultraviolet light generation device according to claim 6, wherein
   the temperature of the condensing mirror is maintained at 5° C. or lower, and
   the temperature of the chamber container is maintained at 15° C. to 25° C. inclusive.

9. The extreme ultraviolet light generation device according to claim 6, further comprising:
   a third temperature sensor configured to detect the temperature of the condensing mirror; and
   a control unit configured to control the cooling device to change at least one of a temperature and a flow rate of the third cooling medium in accordance with the temperature detected by the third temperature sensor.

10. The extreme ultraviolet light generation device according to claim 1, wherein at least part of a surface of the heat shield is coated with at least one of $TiO_2$ and ZrN.

11. The extreme ultraviolet light generation device according to claim 1, wherein a surface roughness Ra of at least part of the heat shield is 6.3 μm or less.

12. The extreme ultraviolet light generation device according to claim 1, wherein a surface roughness Ra of at least part of the heat shield is 1.6 μm or less.

13. An extreme ultraviolet light generation device configured to generate extreme ultraviolet light by irradiating a target containing tin with a pulse laser beam, the extreme ultraviolet light generation device comprising:
- a chamber container;
- a hydrogen gas supply unit configured to supply hydrogen gas into the chamber container;
- a heat shield disposed between the chamber container and a predetermined region in which the target is irradiated with the pulse laser beam inside the chamber container;
- a first cooling medium flow path disposed in the chamber container;
- a second cooling medium flow path disposed in the heat shield; and
- a cooling device configured to supply a first cooling medium to the first cooling medium flow path and supply a second cooling medium having a temperature lower than a temperature of the first cooling medium to the second cooling medium flow path.

14. The extreme ultraviolet light generation device according to claim 13, wherein the cooling device
- is disposed in a flow path of process cooling water,
- supplies a first cooling medium having a temperature equal to or higher than a temperature of the process cooling water to the first cooling medium flow path, and
- supplies a second cooling medium having a temperature lower than the temperature of the process cooling water to the second cooling medium flow path.

15. The extreme ultraviolet light generation device according to claim 13, wherein the cooling device includes
- a heat exchanger configured to supply the first cooling medium to the first cooling medium flow path, and
- a chiller configured to supply the second cooling medium to the second cooling medium flow path.

16. The extreme ultraviolet light generation device according to claim 13, further comprising:
- a condensing mirror configured to reflect and condense the extreme ultraviolet light radiated from the predetermined region; and
- a third cooling medium flow path disposed in the condensing mirror,
- wherein the cooling device supplies a third cooling medium having a temperature lower than the temperature of the first cooling medium to the third cooling medium flow path.

17. The extreme ultraviolet light generation device according to claim 16, wherein the cooling device
- is disposed in a flow path of process cooling water,
- supplies a first cooling medium having a temperature equal to or higher than a temperature of the process cooling water to the first cooling medium flow path,
- supplies a second cooling medium having a temperature lower than the temperature of the process cooling water to the second cooling medium flow path, and
- supplies a third cooling medium having a temperature lower than the temperature of the process cooling water to the third cooling medium flow path.

18. The extreme ultraviolet light generation device according to claim 16, wherein the cooling device includes
- a heat exchanger configured to supply the first cooling medium to the first cooling medium flow path,
- a first chiller configured to supply the second cooling medium to the second cooling medium flow path, and
- a second chiller configured to supply the third cooling medium to the third cooling medium flow path.

19. An electronic device manufacturing method comprising:
- generating extreme ultraviolet light by irradiating a target with a pulse laser beam in an extreme ultraviolet light generation device including
  - a chamber container,
  - a hydrogen gas supply unit configured to supply hydrogen gas into the chamber container,
  - a heat shield disposed between the chamber container and a predetermined region in which the target is irradiated with the pulse laser beam inside the chamber container,
  - a first cooling medium flow path disposed in the chamber container,
  - a second cooling medium flow path disposed in the heat shield, and
  - a cooling device configured to supply a first cooling medium to the first cooling medium flow path and supply a second cooling medium to the second cooling medium flow path so that a temperature of the heat shield becomes lower than a temperature of the chamber container;
- outputting the extreme ultraviolet light to an exposure apparatus; and
- exposing a photosensitive substrate to the extreme ultraviolet light in the exposure apparatus to manufacture an electronic device.

20. An electronic device manufacturing method comprising:
- generating extreme ultraviolet light by irradiating a target with a pulse laser beam in an extreme ultraviolet light generation device including
  - a chamber container,
  - a hydrogen gas supply unit configured to supply hydrogen gas into the chamber container,
  - a heat shield disposed between the chamber container and a predetermined region in which the target is irradiated with the pulse laser beam inside the chamber container,
  - a first cooling medium flow path disposed in the chamber container,
  - a second cooling medium flow path disposed in the heat shield, and
  - a cooling device configured to supply a first cooling medium to the first cooling medium flow path and supply a second cooling medium having a temperature lower than a temperature of the first cooling medium to the second cooling medium flow path;
- outputting the extreme ultraviolet light to an exposure apparatus; and
- exposing a photosensitive substrate to the extreme ultraviolet light in the exposure apparatus to manufacture an electronic device.

* * * * *